United States Patent [19]

Suzuta et al.

[11] Patent Number: 4,615,515
[45] Date of Patent: Oct. 7, 1986

[54] PRECISE MOVEMENT DEVICE

[75] Inventors: Mikio Suzuta, Tokyo; Hironori Yamamoto, Chigasaki; Kazuo Nakazawa, Yokohama, all of Japan

[73] Assignee: Canon Kabushiki Kaisha, Tokyo, Japan

[21] Appl. No.: 681,590

[22] Filed: Dec. 14, 1984

[30] Foreign Application Priority Data

Dec. 27, 1983 [JP]  Japan ................................. 58-250550

[51] Int. Cl.4 ............................................... B25B 1/22
[52] U.S. Cl. ....................................... 269/73; 188/43; 355/53
[58] Field of Search ............... 355/53, 86, 95; 196/73; 188/40, 41, 42, 43

[56] References Cited
U.S. PATENT DOCUMENTS 4,234,175 11/1980 Sato et al. ............................ 269/73
4,370,054 1/1983 Isohata et al. ........................ 355/53
4,538,706 9/1985 Koppensteiner ..................... 188/41

Primary Examiner—R. Skudy
Attorney, Agent, or Firm—Fitzpatrick, Cella, Harper & Scinto

[57] ABSTRACT

A precise movement device of the type for guiding a movable member with hydrostatic pressure or a magnetic field and moving the movable member substantially without a friction. The device includes a mechanism for supporting the movable member by the use of hydrostatic pressure or a magnetic field and for guiding the movement of the movable member, and includes a mechanism for generating a resistance against the movement of the movable member when the movable member is to be stopped, such that the movable member can be stopped at a desired position accurately and in a reduced time.

7 Claims, 5 Drawing Figures

PRECISE MOVEMENT DEVICE

BACKGROUND OF THE INVENTION

This invention relates to a precise movement device for use in an apparatus for exposing a semiconductor wafer apparatus to a pattern on a mask with radiation, a precise measurement device or the like. More particularly, it relates to a precise movement device of the type for guiding a movable member with hydrostatic pressure or a magnetic field and for moving the movable member substantially without friction.

Such precise movement devices are known and generally include, as means for guiding a movable member such as a slider or rotor, hydrostatic guiding mechanisms using air or oils because of their guiding accuracy, durability and easy maintenance. In these precise movement devices, however, vibrations are liable to occur when the slider or rotor is stopped at a predetermined position, the vibrations being in the direction of advancement in the case of slider and being in the direction of rotation in the case of rotor. Because of the structure of and materials used in such precise movement devices for providing movement substantially without friction, insufficient force is available in the devices to attenuate the vibration. Therefore, a longer time is required to stop the slider or rotor at the predetermined position.

SUMMARY OF THE INVENTION

It is accordingly a primary object of the present invention to provide a precise movement device capable of stopping a movable member at a predetermined position in reduced time.

It is another object of the present invention to provide a precise movement device having improved accuracy in the positioning of a movable member.

In accordance with the present invention, there is provided a precise movement device for moving a movable member, comprising means for guiding the movable member, and means for generating resistance to the movement of the movable member, the resistance generating means controlling generation of the resistance from initiation to termination of the movement of the movable member.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
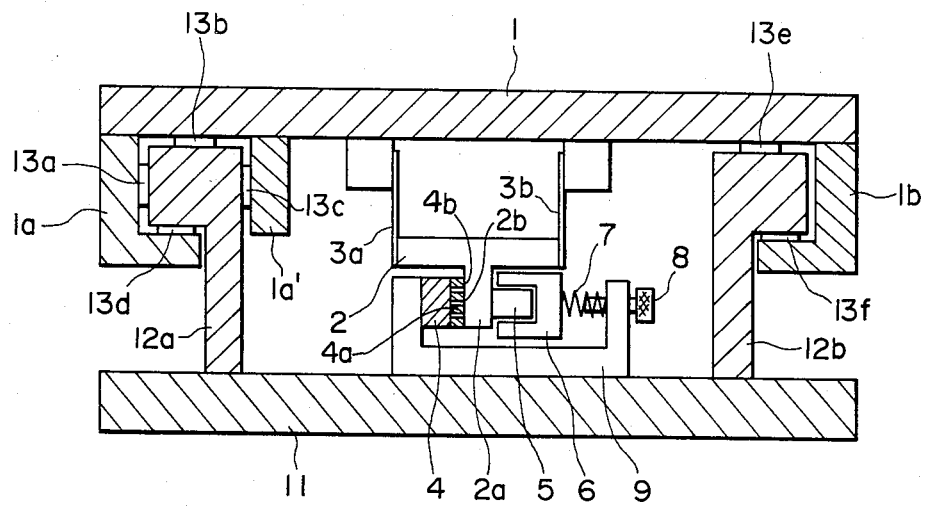
FIG. 1A is a cross-sectional view showing a precise movement device according to one embodiment of the present invention.
Figure 1B:
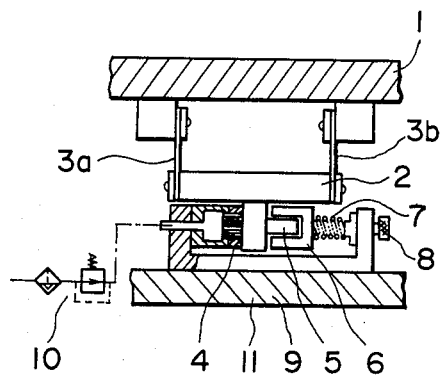
FIG. 1B is a fragmentary cross-sectional view showing a resistance generating portion of the precise movement device shown in FIG. 1A.
Figure 1C:
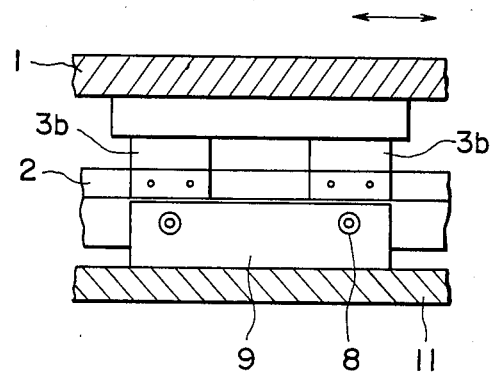
FIG. 1C is a fragmentary side cross-sectional view of the resistance generating portion shown in FIG. 1B.

The invention will now be described with reference to FIGS. 1A–1C showing an embodiment of the precise movement device of the present invention which is applied to a linear positioning or indexing device. The device includes a slider or table 1 which is slidably supported by a linear-motion type hydrostatic guiding mechanism and may be moved by a moving mechanism (not shown). As shown in FIG. 1A, the slider 1 has depending ears 1a, 1a' and 1b with ears 1a and 1a' engaged with guide rail 12a and ear 1b engaged with guide rail 12b. The ears are formed on the stator or stationary portion 11 and extend in the direction perpendicular to the sheet of the drawing. Fluid pads 13a–13f are provided between the guide rails 12a, 12b, slider 1 and depending ears 1a, 1a', and 1b, as shown in FIG. 1A, thus providing the hydrostatic guiding mechanism. The stator 11 thus supports the slider 1 by way of the hydrostatic guiding mechanism and the guide rails 12a and 12b. A sliding plate 2 extends in the direction perpendicular to the sheet of FIG. 1A and is disposed at a position depending from an intermediate portion of the lower surface of the slider 1. Leaf springs or resilient members 3a and 3b are provided to connect or couple the sliding plate 2 with the slider 1 and are adapted to absorb any forces in the lateral direction as viewed in FIG. 1A. The sliding plate 2 has a downwardly protruding extension or member 2a so that the sliding plate 2 has a T-shaped cross-section.

The device includes two sets of sliding resistance generating mechanisms, only one of which will now be described for the sake of simplicity.

On the left-hand side of the extension or member 2a, there is provided a brush member 4 extending in the same direction as the sliding plate 2 and having a length, e.g., approx. one fifth of that of the sliding plate 2. The brush member 4 has formed therein one or more small bores or parts 4a for discharging therethrough hydraulic pressurized fluids such as air, oils or oil mists comprising mixed air and oil. In the position shown in FIG. 1A, the right side surface 4b of the brush member 4 is in contact with the left-hand side surface 2b of the extension 2a of the sliding plate 2.

The brush 4 and extension 2a comprise means for applying a resistance to movement of the slider or table 1 relative to the stator or stationary portion 11.

On the right-hand side of the extension 2a, there is provided a bracket member 6 which is spaced from the extension 2a by a minute distance. A roller 5 is provided within the bracket 6 and is connected thereto through a shaft and bearings, not shown in the drawings, so that the roller 5 is supported by the bracket 6 for smooth rotational movement. The roller 5 is in contact with the right-hand side of the extension 2a of the sliding plate 2. A compressed coiled spring 7 is fixed on the outer surface of the bracket 6 at the right-hand side thereof as viewed in FIG. 1a. The spring 7 is adapted to urge, through the bracket 6 and the roller 5, which together comprise an urging member or means, the extension 2a of the sliding plate 2 against the brush member 4 so that the extension 2a is brought into contact with the brush member 4. All of the brush member 4, extension 2a of the sliding plate 2, roller 5, bracket 6 and spring 7 are housed in a housing member 9. The housing member 9 is effective to define the parallelism between the direction of movement of the slider 1 and the abutment surface of the brush member 4. The housing 9 is secured on the stator 11. An adjusting screw 8 is mounted on the housing 9 to adjust the compressive force of the spring 7 and constitutes means for adjusting the compression or urging force.

The brush element 4 may be made of a solid sliding or low friction material (such as Teflon material, graphite material, etc.), a metallic bearing material (such as gunmetal, phosphor bronze, etc.), an alumina-ceramic material or the like. If a porous material is used, the aforementioned bores for discharging the hydraulic fluid may be unnecessary.

Designated by a reference numeral 10 in FIG. 1B is a schematically illustrated hydraulic fluid pressure regulating circuit or pressure controlling means for supplying the brush element 4 with a pressurized hydraulic fluid such as water, oil or air. The hydraulic fluid supplied from the regulating circuit 10 is discharged from the exit ports of the bores at the surface of the brush element 4 abutting against the extension 2a of the sliding plate 2. When the discharging pressure of the fluid is high, the brush element 4 is spaced away from the extension 2a of the sliding plate 2. When, on the other hand, the discharging pressure is low, the brush element 4 becomes substantially in contact with the extension 2a of the sliding plate 2. Thus, by changing the discharging pressure of the hydraulic fluid, the pressure produced between the surfaces of the sliding plate 2 and the brush element 4 is changed accordingly and, therefore, the sliding resistance against the slider 1 is changed accordingly.

When, in operation, the slider 1 moves in the direction perpendicular to the sheet of FIG. 1A under influence of the moving mechanism, the sliding plate 2 supported by the leaf springs 3a and 3b is moved in the same direction as the advancing direction of the slider 1 without affecting the linearity in the advancement of the slider 1. When the slider 1 is to be stopped, the fluid discharging pressure from the brush member 4 is reduced so that the extension 2a of the sliding plate 2 is urged by the roller 5 and spring 7 against the brush element 4 which is in a reduced-pressure state. Therefore, a sliding resistance occurs between the brush element 4 and the advancing slider 1. This sliding resistance acts as an attenuation force relative to the advancing force of the slider 1 when it is to be stopped.

In this manner, the hydraulic fluid pressure to be applied to the brush element 4 is increased during the advancing movement of the slider 1 and is decreased when the slider 1 comes close to the stop position. This assures precise positioning of the slider 1 without causing any vibrations.

Figure 2:
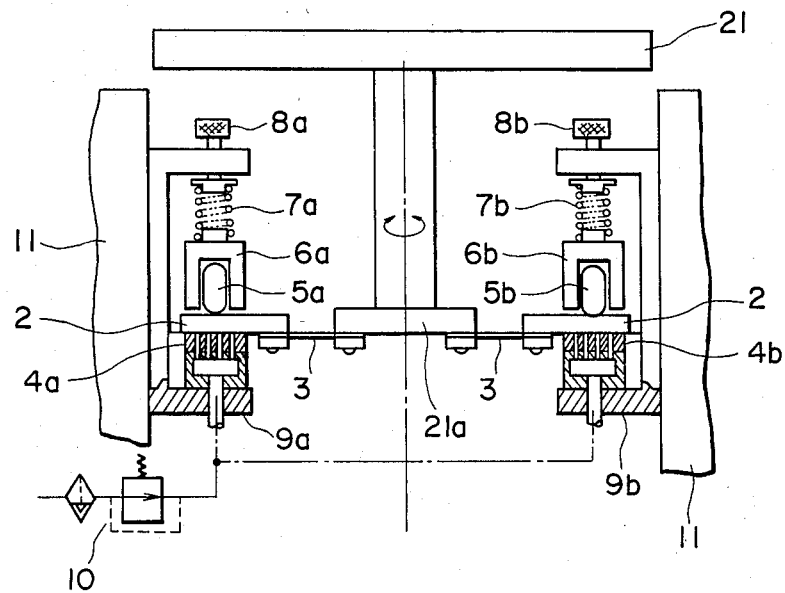
FIG. 2 is a cross-sectional view showing a precise movement device according to another embodiment of the present invention.

Another embodiment of the present invention will now be described with reference to FIG. 2. In this embodiment, the precise movement device of the present invention is applied to a precise-rotation type angular positioning or indexing device. The device includes a rotor or movable table 21 which is supported by a rotary type hydrostatic guiding mechanism and is driven by a rotary drive mechanism (not shown). An annular sliding plate 2 is connected to the lower end portion 21a of the rotor 21 through a leaf spring 3.

The device includes two sets of sliding resistance generating mechanisms or resistance applying means which are disposed symmetrically with respect to the center of rotation of the rotor 21.

At the lower surface, the sliding plate 2 is in contact with brush elements 4a and 4b, respectively. Each of the brush elements 4a and 4b is formed with one or more bores for discharging therethrough hydraulic pressurized fluids such as water, oil, air, etc. Above the upper surface of the sliding plate 2, there are provided brackets 6a and 6b which are spaced slightly from the sliding plate 2. Within the brackets 6a and 6b, there are provided rollers 5a and 5b which are connected to the respective brackets 6a and 6b by means of unshown rotational shafts and unshown bearings so that the rollers 5a and 5b are rotatable along the upper surface of the sliding plate 2. Compressed coiled springs 7a and 7b are mounted on the upper surfaces of the brackets 6a and 6b, respectively, to urge the sliding plate 2 toward the brush elements 4a and 4b, respectively. Housing elements 9a and 9b are provided for housing the brush element 4a (or 4b), the bracket 6a (or 6b) and the spring 7a (or 7b). Each of the housings 9a and 9b is effective to define the parallelism between the rotational surface of the rotor 21 and the abutment surface of the brush element 4a or 4b. On the upper and inner surfaces of the housing elements 9a and 9b, there are provided adjusting screws 8a and 8b, respectively, for adjusting the compression forces to urge the sliding plate 2 against the brush elements 4a and 4b. Designated by a reference numeral 10 is a schematically illustrated hydraulic pressure regulating circuit for supplying each of the brush elements 4a and 4b with a hydraulic pressurized fluid such as air, water, oil, etc. The above-described structure of the FIG. 2 embodiment is essentially the same as that of the first-mentioned embodiment except for the point that the linear motion of the slider 1 is replaced by the rotational motion of the rotor 21. Thus, the sliding plate 2, brush elements 4a and 4b, rollers 5a and 5b, brackets 6a and 6b, springs 7a and 7b, housing elements 9a and 9b, hydraulic pressure regulating circuit 10 and adjusting screws 8a and 8b all have substantially the same functions as of the corresponding members of the first-mentioned embodiment.

Figure 3:
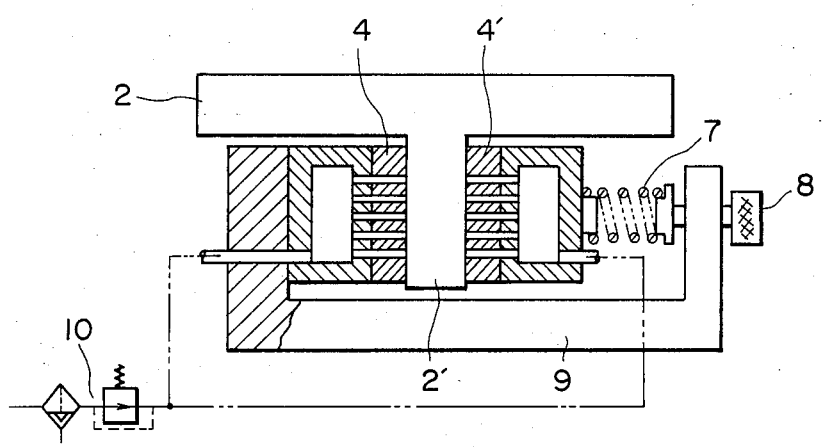
FIG. 3 is a cross-sectional view showing a precise movement device according to a further embodiment of the present invention.

A further embodiment of the present invention will now be described with reference to FIG. 3. The FIG. 3 embodiment is a modification of the embodiment described with reference to FIGS. 1A–1C. That is, the roller 5 and the bracket 6 of the embodiment of FIGS. 1A–1C are replaced by an additional brush element 4'. In FIG. 3, a sliding plate 2 has a downwardly protruding extension 2' both sides of which are in contact with a respective brush element 4 and 4', respectively. Each of the brush elements 4 and 4' is provided with one or a plurality of bores for discharging therethrough a hydraulic pressurized fluid, similarly to the foregoing embodiments. These bores are connected to a hydraulic pressure regulating circuit 10 for supplying the pressurized fluid to each of the brushes 4 and 4'. If the brush elements 4 and 4' are made of porous materials, it may not be necessary to additionally provide the above-mentioned fluid discharging bores. An coiled spring 7 is mounted on the right-hand side of the right brush element 4'. Denoted by a reference numeral 9 is a housing element for housing therein the extension 2' of the sliding plate 2, brush elements 4 and 4', and the coiled spring 7. An adjusting screw 8 is mounted on the right outer wall of the housing 9 to adjust the compressive force of the spring 7.

When, in operation, the hydraulic pressurized fluid supplied from the hydraulic pressure regulating circuit 10 is discharged from the bores formed in the brush elements 4 and 4', and if the discharging pressure is high, the brush elements 4 and 4' are spaced from the extension 2' of the sliding plate 2 so that the sliding resistance becomes very small. If, on the other hand, the discharging pressure is low, the brush elements 4 and 4' are in contact with the extension 2' of the sliding plate 2 so that the sliding resistance becomes great. In this manner, the sliding resistance can be controlled. Accordingly, the sliding resistance is made small for the movement of the slider 1, while it is made large when the slider 1 is to be stopped at a desired position.

While, in the foregoing embodiments, the brush element is provided on the stator 11 side and the sliding plate 2 is provided on the slider 1 side, this arrangement may be reversed.

In accordance with the present invention, as has hitherto been described, the precise movement device can be provided with a function to attenuating any vibration of the slider or rotor without affecting the accuracy of the linear movement of the slider or the accuracy of the rotational movement of the rotor. As a result, the slider or rotor can be stopped at a desired position in a decreased time. Further, according to the present invention, the pressure of fluid which is supplied to the brush element abutting against the sliding plate connected to the slider or rotor can be adjusted. With this arrangement, the driving force acting on the slider or rotor can be controllably decreased and the positioning accuracy can be remarkably improved.

While the invention has been described with reference to the structures disclosed herein, it is not confined to the details set forth and this application is intended to cover such modifications or changes as may come within the purposes of the improvements or the scope of the following claims.

What is claimed is:

1. A device for use in a semiconductor circuit manufacturing apparatus that includes a stationary portion and a table mounted for movement relative to the stationary portion, said device selectively resisting movement of the movable table, and comprising:

means for applying a resistance to movement of the movable table, said resistance applying means including a first member having a surface and a second member having a surface opposed to the surface of said first member, one of said first and second members being coupled to the movable table and the other of said first and second members being coupled to the stationary portion of said apparatus, said surfaces of said first and second members being contactable with each other so as to apply resistance against movement of the movable table, and said second member having a port formed in said surface thereof for discharging fluid toward said surface of said first member; and means for controlling the pressure of the fluid discharged from said port of said second member to control the resistance applied against the movement of the movable table so as to increase the resistance applied when the movable table is to be stopped from moving.

2. A device according to claim 1, wherein said first and second members are arranged so that said surfaces of said first and second members are contactable with each other at higher pressure when the pressure of fluid discharged from said port of said second member is decreased under control of said controlling means, so that relatively large resistance is applied against movement of the movable table; and so that said surface of said second member is urged away from said surface of said first member when the pressure of fluid discharged from said port is increased under control of said controlling means, so that relatively small resistance is applied against movement of the movable table.

3. A device according to claim 2, further comprising a resilient member for coupling said one of said first and second members to the movable table.

4. A device according to claim 3, wherein said resilient member comprises a leaf spring.

5. A device according to claim 3, wherein said resistance applying means further includes an urging member for urging one of said first and second members toward the other thereof.

6. A device according to claim 5, wherein said urging member includes means for adjusting the urging force for urging one of said first and second members toward the other thereof.

7. A device according to claim 1, wherein the movable table is a rotatable member and wherein said resistance applying means applies the resistance against rotational movement of the rotatable member at two points which are symmetrical with respect to a center of rotation of the rotatable member.

* * * * *